(12) United States Patent
Kuczek et al.

(10) Patent No.: US 10,921,578 B2
(45) Date of Patent: Feb. 16, 2021

(54) EYECUPS FOR OPTICS

(71) Applicant: Sensors Unlimited, Inc., Princeton, NJ (US)

(72) Inventors: Andrzej Ernest Kuczek, Bristol, CT (US); Eric Hansell, New Milford, CT (US)

(*) Notice: Subject to any disclaimer, the term of this patent is extended or adjusted under 35 U.S.C. 154(b) by 232 days.

(21) Appl. No.: 16/125,481

(22) Filed: Sep. 7, 2018

(65) Prior Publication Data
US 2020/0081242 A1    Mar. 12, 2020

(51) Int. Cl.
*G02B 21/00* (2006.01)
*G02B 23/16* (2006.01)
(Continued)

(52) U.S. Cl.
CPC ........... *G02B 25/001* (2013.01); *G01R 33/07* (2013.01)

(58) Field of Classification Search
CPC ............... G02B 25/001; G02B 25/005; G02B 27/0006; G02B 1/041; G03B 11/046; G03B 11/041; G03B 11/045; G03B 11/04; G03B 17/566; G03B 13/02; G03B 13/06; F41G 1/38; F41G 1/383; A61B 3/0083;
(Continued)

(56) References Cited

U.S. PATENT DOCUMENTS 2,452,592 A    11/1948 Meyer
2,627,659 A    2/1953 Murr
(Continued)

FOREIGN PATENT DOCUMENTS

CN    202057884    11/2011
CN    204730844    10/2015
(Continued)

OTHER PUBLICATIONS

Aebi, V. et al., "EBAPS: Next Generation, Low Power, Digital Night Vision", Presented at the OPTRO 2005 International Symposium, May 10, 2005, pp. 1-10, Paris, France, in 10 pages.
(Continued)

*Primary Examiner* — William R Alexander
*Assistant Examiner* — Tamara Y. Washington
(74) *Attorney, Agent, or Firm* — Knobbe, Martens, Olson & Bear, LLP

(57) ABSTRACT

An eyecup for an optic can include an elastic body forming an eye receiver and a viewing cavity, the elastic body configured to move between a relaxed state and a compressed state. The eyecup can include a diaphragm formed from or attached to an inner surface of the elastic body, the diaphragm including one or more flaps configured to be in a closed position when the elastic body is in the relaxed state such that the one or more flaps block sight of an optic through the viewing cavity, and to be in an open position when the elastic body is in the compressed state such that the one or more flaps allow sight of an optic through the viewing cavity. The eyecup can include one or more magnets disposed on at least one of the one or more flaps to move with the one or more flaps, and one or more sensors disposed in a fixed location and configured to sense a magnetic field or flux thereof of the one or more magnets to sense the one or more magnets when the flaps are in or near or moving toward the open position.

16 Claims, 5 Drawing Sheets

(51) Int. Cl.
  *G02B 25/00* (2006.01)
  *G01R 33/07* (2006.01)

(58) Field of Classification Search
  CPC .......... A61B 3/10; A61B 3/185; A61B 3/125; A61B 3/145; A61B 1/00126; A61B 1/00128; A61B 1/00195; A61F 9/023; A61F 9/067
  USPC .................................. 359/600; 604/295–302
  See application file for complete search history.

(56) References Cited

U.S. PATENT DOCUMENTS

| | | | |
|---|---|---|---|
| 2,901,750 A | 9/1959 | McMurry | |
| 2,901,751 A | 9/1959 | Gales et al. | |
| 2,908,943 A | 10/1959 | Miller | |
| 3,320,619 A | 5/1967 | Lastnik et al. | |
| 3,413,656 A | 12/1968 | Vogliano et al. | |
| 3,419,334 A | 12/1968 | Hubbard | |
| 3,594,061 A * | 7/1971 | Selvage | G02B 23/125 359/600 |
| 3,594,062 A * | 7/1971 | Disley | G02B 23/125 359/600 |
| 3,640,635 A | 2/1972 | Von Hollen | |
| 3,669,523 A * | 6/1972 | Edwards, Jr. | G02B 23/16 359/600 |
| 4,044,399 A | 8/1977 | Morton | |
| 4,183,646 A | 1/1980 | Tsunefuji | |
| 4,415,952 A * | 11/1983 | Hattori | G02B 23/16 362/572 |
| 4,584,776 A | 4/1986 | Shepherd | |
| 4,601,540 A * | 7/1986 | Karning | G02B 23/16 359/234 |
| 4,605,281 A | 8/1986 | Hellewell | |
| 4,630,903 A * | 12/1986 | Jones | G02B 23/16 359/600 |
| 4,698,489 A | 10/1987 | Morley | |
| 4,758,719 A | 7/1988 | Sasaki et al. | |
| 4,786,966 A | 11/1988 | Hanson et al. | |
| 4,792,206 A | 12/1988 | Skuratovsky | |
| 4,840,451 A | 6/1989 | Sampson et al. | |
| 5,005,213 A | 4/1991 | Hanson et al. | |
| 5,035,472 A | 7/1991 | Hansen | |
| 5,125,394 A | 6/1992 | Chatenever et al. | |
| 5,128,807 A | 7/1992 | Blackmon | |
| 5,140,151 A | 8/1992 | Weiner et al. | |
| 5,303,606 A | 4/1994 | Kokinda | |
| 5,303,688 A | 4/1994 | Chiuminatta et al. | |
| 5,359,675 A | 10/1994 | Siwoff | |
| 5,408,359 A * | 4/1995 | Ferrett | G02B 5/005 250/214 VT |
| 5,448,161 A | 9/1995 | Byerley, III et al. | |
| 5,463,495 A | 10/1995 | Murg | |
| 5,513,440 A | 5/1996 | Murg | |
| 5,535,053 A | 7/1996 | Baril et al. | |
| 5,584,137 A | 12/1996 | Teetzel | |
| 5,623,367 A * | 4/1997 | Immel | G02B 5/005 359/600 |
| 5,651,081 A | 7/1997 | Blew et al. | |
| 5,653,034 A | 8/1997 | Bindon | |
| 5,668,904 A | 9/1997 | Sutherland et al. | |
| 5,687,271 A | 11/1997 | Rabinowitz | |
| 5,711,104 A | 1/1998 | Schmitz | |
| 5,842,054 A * | 11/1998 | Suzuki | G02B 27/646 396/55 |
| 5,847,753 A | 12/1998 | Gabello et al. | |
| 5,881,449 A | 3/1999 | Ghosh et al. | |
| 5,903,996 A | 5/1999 | Morley | |
| 5,946,132 A | 8/1999 | Phillips | |
| 5,949,565 A | 9/1999 | Ishida | |
| 5,953,761 A | 9/1999 | Jurga et al. | |
| 5,956,444 A | 9/1999 | Duda et al. | |
| 6,020,994 A | 2/2000 | Cook | |
| 6,057,966 A | 5/2000 | Carroll et al. | |
| 6,200,041 B1 | 3/2001 | Gaio et al. | |
| 6,272,692 B1 | 8/2001 | Abraham | |
| 6,311,576 B1 | 11/2001 | Pletschet | |
| 6,327,381 B1 | 12/2001 | Rogina et al. | |
| 6,369,941 B2 | 4/2002 | Zadravec | |
| 6,381,081 B1 | 4/2002 | Ford | |
| 6,404,961 B1 | 6/2002 | Bonja et al. | |
| 6,456,497 B1 | 9/2002 | Palmer | |
| 6,519,890 B1 | 2/2003 | Otterman | |
| 6,560,029 B1 | 5/2003 | Dobbie et al. | |
| 6,574,053 B1 | 6/2003 | Spinali | |
| 6,615,531 B1 | 9/2003 | Holmberg | |
| 6,690,866 B2 | 2/2004 | Bonja et al. | |
| 6,714,708 B2 | 3/2004 | McAlpine et al. | |
| 6,807,742 B2 | 10/2004 | Schick et al. | |
| 6,898,192 B2 | 5/2005 | Chheda et al. | |
| 6,901,221 B1 | 5/2005 | Jiang et al. | |
| 7,016,579 B2 | 3/2006 | Militaru et al. | |
| 7,062,796 B1 | 6/2006 | Dixon | |
| D524,785 S | 7/2006 | Huang | |
| 7,069,685 B2 | 7/2006 | Houde-Walter | |
| 7,096,512 B2 | 8/2006 | Blair | |
| 7,128,475 B2 | 10/2006 | Kesler | |
| 7,132,648 B2 | 11/2006 | Ratiff et al. | |
| 7,166,812 B2 | 1/2007 | White et al. | |
| 7,171,776 B2 | 2/2007 | Staley, III | |
| 7,194,012 B2 | 3/2007 | Mason et al. | |
| 7,210,262 B2 | 5/2007 | Florence et al. | |
| 7,210,392 B2 | 5/2007 | Greene et al. | |
| 7,219,370 B1 | 5/2007 | Teetzel et al. | |
| 7,278,734 B2 | 10/2007 | Jannard et al. | |
| 7,292,262 B2 | 11/2007 | Towery et al. | |
| 7,298,941 B2 | 11/2007 | Palen et al. | |
| 7,319,557 B2 | 1/2008 | Tai | |
| 7,369,302 B2 | 5/2008 | Gaber | |
| 7,409,792 B2 | 8/2008 | Narcy et al. | |
| 7,437,848 B2 | 10/2008 | Chang | |
| 7,462,035 B2 | 12/2008 | Lee et al. | |
| 7,488,294 B2 | 2/2009 | Torch | |
| 7,552,559 B2 | 6/2009 | Day | |
| 7,609,467 B2 | 10/2009 | Blanding et al. | |
| 7,612,956 B2 | 11/2009 | Blanding et al. | |
| 7,627,975 B1 | 12/2009 | Hines | |
| 7,649,550 B2 | 1/2010 | Lshiyama et al. | |
| 7,676,137 B2 | 3/2010 | Schick et al. | |
| 7,690,849 B2 | 4/2010 | Scharf et al. | |
| 7,701,493 B2 | 4/2010 | Mauritzson | |
| 7,705,855 B2 | 4/2010 | Brown Elliott | |
| 7,710,654 B2 | 5/2010 | Ashkenazi et al. | |
| 7,730,820 B2 | 6/2010 | Vice et al. | |
| 7,740,499 B1 | 6/2010 | Willey et al. | |
| 7,744,286 B2 | 6/2010 | Lu et al. | |
| 7,787,012 B2 | 8/2010 | Scales et al. | |
| 7,795,574 B2 | 9/2010 | Kennedy et al. | |
| 7,800,852 B2 | 9/2010 | Blanding et al. | |
| 7,827,723 B1 | 11/2010 | Zaderey et al. | |
| 7,832,023 B2 | 11/2010 | Crisco | |
| 7,842,922 B2 | 11/2010 | Leneke et al. | |
| 7,899,332 B2 | 3/2011 | Shindou et al. | |
| 7,911,687 B2 | 3/2011 | Scholz | |
| 7,916,156 B2 | 3/2011 | Brown Elliott et al. | |
| 7,933,464 B2 | 4/2011 | Zhang et al. | |
| 7,952,059 B2 | 5/2011 | Vitale et al. | |
| 7,972,067 B2 | 7/2011 | Haley et al. | |
| 7,990,523 B2 | 8/2011 | Schlierbach et al. | |
| 8,014,679 B2 | 9/2011 | Yamazaki | |
| 8,063,934 B2 | 11/2011 | Donato | |
| 8,067,735 B2 | 11/2011 | King et al. | |
| 8,082,688 B2 | 12/2011 | Elpedes et al. | |
| 8,085,482 B2 | 12/2011 | Frankovich et al. | |
| 8,093,992 B2 | 1/2012 | Jancic et al. | |
| 8,112,185 B2 | 2/2012 | Wu | |
| 8,153,975 B2 | 4/2012 | Hollander et al. | |
| 8,225,542 B2 | 7/2012 | Houde-Walter | |
| 8,253,105 B1 | 8/2012 | Warnke et al. | |
| 8,312,667 B2 | 11/2012 | Thomas et al. | |
| 8,336,776 B2 | 12/2012 | Horvath et al. | |
| 8,337,036 B2 | 12/2012 | Soto et al. | |
| 8,350,796 B2 | 1/2013 | Tomizawa et al. | |

(56) References Cited

U.S. PATENT DOCUMENTS

| | | |
|---|---|---|
| 8,375,620 B2 | 2/2013 | Staley, III |
| D677,298 S | 3/2013 | Hallgren |
| 8,411,346 B2 | 4/2013 | Sapir |
| 8,488,969 B1 | 7/2013 | Masarik |
| 8,531,592 B2 | 9/2013 | Teetzel et al. |
| 8,532,490 B2 | 9/2013 | Smith et al. |
| 8,656,628 B2 | 2/2014 | Jock et al. |
| 8,717,392 B2 | 5/2014 | Levola |
| 8,773,766 B2 | 7/2014 | Jannard et al. |
| 8,776,422 B2 | 7/2014 | Dodd et al. |
| 8,781,273 B2 | 7/2014 | Benjamin et al. |
| 8,826,583 B2 | 9/2014 | Kepler et al. |
| 8,849,379 B2 | 9/2014 | Abreu |
| 8,886,046 B2 | 11/2014 | Masarik |
| 8,908,045 B2 | 12/2014 | Stewart |
| 8,923,703 B2 | 12/2014 | Masarik |
| 8,928,878 B2 | 1/2015 | Jaeschke et al. |
| 8,942,632 B2 | 1/2015 | Shen |
| 8,963,573 B2 | 2/2015 | Achkir et al. |
| 9,042,736 B2 | 5/2015 | Masarik |
| 9,052,153 B2 | 6/2015 | Oh et al. |
| 9,057,583 B2 | 6/2015 | Matthews et al. |
| 9,069,001 B2 | 6/2015 | Braman et al. |
| 9,113,061 B1 | 8/2015 | Morley |
| 9,225,419 B2 | 12/2015 | Masarik |
| 9,310,163 B2 | 4/2016 | Bay |
| 9,316,462 B2 | 4/2016 | Varshneya |
| 9,319,143 B2 | 4/2016 | El-Ahmadi et al. |
| 9,335,122 B2 | 5/2016 | Choiniere |
| 9,366,504 B2 | 6/2016 | Hester et al. |
| 9,373,277 B2 | 6/2016 | Sagan |
| 9,389,677 B2 | 7/2016 | Hobby et al. |
| 9,429,391 B2 | 8/2016 | Walker |
| 9,438,774 B2 | 9/2016 | Masarik |
| 9,466,120 B2 | 10/2016 | Maryfield et al. |
| 9,506,725 B2 | 11/2016 | Maryfield et al. |
| 9,516,202 B2 | 12/2016 | Masarik et al. |
| 9,516,266 B2 * | 12/2016 | Pycock ............... H04L 12/1813 |
| 9,593,913 B1 | 3/2017 | Wright et al. |
| 9,615,004 B2 | 4/2017 | Masarik |
| 9,622,529 B2 | 4/2017 | Teetzel et al. |
| 9,658,423 B2 | 5/2017 | Gustafson et al. |
| 9,696,111 B2 | 7/2017 | Saadon |
| 9,705,605 B2 | 7/2017 | Masarik |
| 9,769,902 B1 | 9/2017 | Cain et al. |
| 9,823,043 B2 | 11/2017 | Compton et al. |
| 9,861,263 B2 | 1/2018 | Kwan et al. |
| 9,897,411 B2 | 2/2018 | Compton et al. |
| 9,910,259 B2 | 3/2018 | Armbruster et al. |
| 9,921,028 B2 | 3/2018 | Compton et al. |
| 9,934,739 B2 | 4/2018 | Hogan |
| 9,948,878 B2 | 4/2018 | Simolon et al. |
| 9,995,901 B2 | 6/2018 | Petersen |
| 10,003,756 B2 | 6/2018 | Masarik et al. |
| 10,024,631 B2 | 7/2018 | Portoghese et al. |
| 10,036,869 B2 | 7/2018 | Fahr et al. |
| 10,095,089 B2 | 10/2018 | Po et al. |
| 10,113,837 B2 | 10/2018 | Masarik et al. |
| 10,190,848 B2 | 1/2019 | VanBecelaere |
| 10,309,749 B2 | 6/2019 | Hamilton |
| 10,379,135 B2 | 8/2019 | Maryfield et al. |
| 2002/0027690 A1 | 3/2002 | Bartur et al. |
| 2004/0031184 A1 | 2/2004 | Hope |
| 2005/0058444 A1 | 3/2005 | Watanabe et al. |
| 2005/0114710 A1 | 5/2005 | Cornell et al. |
| 2005/0225575 A1 | 10/2005 | Brown Elliott et al. |
| 2005/0232512 A1 | 10/2005 | Luk et al. |
| 2005/0254126 A1 | 11/2005 | Lin et al. |
| 2005/0268519 A1 | 12/2005 | Pikielny |
| 2006/0165413 A1 | 7/2006 | Schemmann et al. |
| 2007/0003562 A1 | 1/2007 | Druilhe |
| 2007/0035626 A1 | 2/2007 | Randall et al. |
| 2007/0213586 A1 | 9/2007 | Hirose et al. |
| 2007/0257944 A1 | 11/2007 | Miller et al. |
| 2008/0263752 A1 | 10/2008 | Solinsky et al. |
| 2008/0309586 A1 | 12/2008 | Vitale |
| 2008/0317474 A1 | 12/2008 | Wang et al. |
| 2009/0052023 A1 | 2/2009 | Winker et al. |
| 2009/0181729 A1 | 7/2009 | Griffin, Jr. et al. |
| 2010/0027943 A1 | 2/2010 | Armani et al. |
| 2010/0149073 A1 | 6/2010 | Chaum et al. |
| 2010/0225673 A1 | 9/2010 | Miller et al. |
| 2010/0266245 A1 | 10/2010 | Sabo |
| 2010/0308999 A1 | 12/2010 | Chornenky |
| 2010/0328420 A1 | 12/2010 | Roman |
| 2011/0030264 A1 | 2/2011 | Davidson et al. |
| 2011/0041377 A1 | 2/2011 | Thomas et al. |
| 2011/0067288 A1 | 3/2011 | Hakansson et al. |
| 2011/0145981 A1 | 6/2011 | Teetzel |
| 2011/0187563 A1 | 8/2011 | Sanders-Reed |
| 2011/0213664 A1 | 9/2011 | Osterhout et al. |
| 2011/0214082 A1 | 9/2011 | Osterhout et al. |
| 2011/0239354 A1 | 10/2011 | Celona et al. |
| 2012/0030985 A1 | 2/2012 | Mauricio et al. |
| 2012/0033195 A1 | 2/2012 | Tai |
| 2012/0033282 A1 * | 2/2012 | Immel ................... G03B 11/04 359/227 |
| 2012/0097741 A1 | 4/2012 | Karcher |
| 2012/0159833 A1 | 6/2012 | Hakanson et al. |
| 2012/0182417 A1 | 7/2012 | Everett |
| 2012/0182610 A1 | 7/2012 | O'Hara et al. |
| 2012/0192476 A1 | 8/2012 | Compton et al. |
| 2012/0212414 A1 | 8/2012 | Osterhout et al. |
| 2012/0238208 A1 | 9/2012 | Bienas et al. |
| 2012/0255213 A1 | 10/2012 | Panos |
| 2012/0311910 A1 | 12/2012 | Mironichev et al. |
| 2012/0317706 A1 | 12/2012 | Lebel et al. |
| 2012/0320340 A1 | 12/2012 | Coleman, III |
| 2012/0327247 A1 | 12/2012 | Mironichev et al. |
| 2013/0016215 A1 | 1/2013 | Bitar et al. |
| 2013/0033746 A1 | 2/2013 | Brumfield |
| 2013/0036646 A1 | 2/2013 | Rubac et al. |
| 2013/0072120 A1 | 3/2013 | Wu |
| 2013/0088604 A1 | 4/2013 | Hamrelius et al. |
| 2013/0167425 A1 | 7/2013 | Crispin |
| 2013/0188943 A1 | 7/2013 | Wu |
| 2013/0215395 A1 | 8/2013 | Li |
| 2014/0007485 A1 | 1/2014 | Castejon, Sr. |
| 2014/0104449 A1 | 4/2014 | Masarik et al. |
| 2014/0260748 A1 | 9/2014 | Traver |
| 2014/0285882 A1 | 9/2014 | Gotz et al. |
| 2015/0016817 A1 | 1/2015 | Hara et al. |
| 2015/0101234 A1 | 4/2015 | Priest et al. |
| 2015/0226613 A1 | 8/2015 | Bauer et al. |
| 2015/0282549 A1 | 10/2015 | Lebel et al. |
| 2015/0316351 A1 | 11/2015 | Choiniere |
| 2015/0375865 A1 | 12/2015 | Fischer et al. |
| 2016/0033234 A1 | 2/2016 | Swift et al. |
| 2016/0327365 A1 | 11/2016 | Collin et al. |
| 2017/0010073 A1 | 1/2017 | Downing |
| 2017/0078022 A1 | 3/2017 | Masarik et al. |
| 2017/0153713 A1 | 6/2017 | Niinuma et al. |
| 2017/0237919 A1 | 8/2017 | Lamesch |
| 2017/0302386 A1 | 10/2017 | Masarik |
| 2018/0232952 A1 | 8/2018 | Hiranandani et al. |
| 2018/0246135 A1 | 8/2018 | Pan et al. |
| 2018/0302576 A1 | 10/2018 | Masarik et al. |
| 2019/0033039 A1 | 1/2019 | Masarik et al. |
| 2019/0094981 A1 | 3/2019 | Bradski et al. |
| 2019/0166174 A1 | 5/2019 | Moseman |
| 2019/0353461 A1 | 11/2019 | Neal et al. |
| 2019/0353462 A1 | 11/2019 | Neal |
| 2020/0014887 A1 | 1/2020 | Moseman et al. |
| 2020/0051481 A1 | 2/2020 | Masarik et al. |
| 2020/0053303 A1 | 2/2020 | Vaklev et al. |

FOREIGN PATENT DOCUMENTS

| | | |
|---|---|---|
| CN | 204944509 | 1/2016 |
| CN | 106612141 | 5/2017 |
| EP | 176169 A2 | 4/1986 |
| EP | 2 722 632 | 4/2014 |
| EP | 2 812 749 | 12/2014 |
| EP | 3 172 524 | 5/2017 |

(56) References Cited

FOREIGN PATENT DOCUMENTS

| | | | |
|---|---|---|---|
| EP | 3 205 974 | 8/2017 | |
| EP | 3 239 754 | 11/2017 | |
| GB | 2162654 | 2/1986 | |
| JP | H07-295682 | 11/1995 | |
| WO | WO 2005/121688 | 12/2005 | |
| WO | WO 2013/080058 | 6/2013 | |
| WO | WO-2013080058 A1 * | 6/2013 | ............. G02B 23/16 |
| WO | WO 2013/102869 | 7/2013 | |
| WO | WO 2013/119983 | 8/2013 | |
| WO | WO 2014/062725 | 4/2014 | |
| WO | WO 2014/150076 | 9/2014 | |
| WO | WO 2016/014655 | 1/2016 | |
| WO | WO 2019/222422 | 11/2019 | |
| WO | WO 2019/222426 | 11/2019 | |

OTHER PUBLICATIONS

Ackerman, S., "It Only Took the Army 16 Years and 2 Wars to Deploy this Network", Wired.com, Jun. 28, 2012, in 7 pages. URL: http://www.wired.com/dangerroom/2012/06/army-data-network-war/all/.

Armstrong, S. C., "Project Manager Soldier Weapons Program Overview NDIA", May 15, 2012, in 38 pages.

Schott—Glass Made of Ideas, GBPS-MC-GOF-Demo, dated Jan. 2006, pp. S.1-S.8, in 8 pages.

Sklarek, W., "High Data Rate Capabilities of Multicore Glass Optical Fiber Cables, 22 FGT 'Otische Polymerfasern'", dated Oct. 25, 2006, in 19 pages. URL: http://www.pofac.de/downloads/itgfg/fgt2.2/FGT2.2_Munchen_Sklarek_GOF-Buendel.

Tao, R. et al., "10 Gb/s CMOS Limiting Amplifier for Optical links", Proceedings of the 29th European Solid-State Circuits Conference, Sep. 16-18, 2013, pp. 285-287, Estoril, Portugal, in 3 pages.

Zhu, Z. et al., "AR-Weapon: Live Augmented Reality Based First-Person Shooting System", 2015 IEEE Winter Conference on Applications of Computer Vision, Feb. 2015, in 8 pages.

PCT Application No. PCT/US2019/049969 International Search Report and Written Opinion dated Nov. 19, 2019, in 10 pages.

\* cited by examiner

EYECUPS FOR OPTICS

BACKGROUND

1. Field

The present disclosure relates to optics, more specifically to eyecups for optics.

2. Description of Related Art

Elastic eyecups are typically used on optical equipment for the user comfort and reduction of ambient light noise. However, in some cases emission of the light from the device is not desirable. Mechanical shutters or electric switches can be used to power up and down digital eye displays as needed to eliminate light emission. Traditional designs may utilize hall-effect switches and a strong magnet in a "normal to face" configuration. Such arrangements require a strong and precisely selected magnet since the magnet must provide required magnetic flux density at a specific distance. The magnetic flux density changes with temperature and magnets are made within a certain tolerance, thus it is very difficult to maintain a specified switching distance that allow traditional eyecup to function.

Such conventional methods and systems have generally been considered satisfactory for their intended purpose. However, there is still a need in the art for improve eyecups for optics. The present disclosure provides a solution for this need.

SUMMARY

An eyecup for an optic can include an elastic body forming an eye receiver and a viewing cavity, the elastic body configured to move between a relaxed state and a compressed state. The eyecup can include a diaphragm formed from or attached to an inner surface of the elastic body, the diaphragm including one or more flaps configured to be in a closed position when the elastic body is in the relaxed state such that the one or more flaps block sight of an optic through the viewing cavity, and to be in an open position when the elastic body is in the compressed state such that the one or more flaps allow sight of an optic through the viewing cavity.

The eyecup can include one or more magnets disposed on at least one of the one or more flaps to move with the one or more flaps, and one or more sensors disposed in a fixed location (e.g., relative to the portion of the eyecup that is fixed relative to the optic), e.g., such as on or in the elastic body, and configured to sense a magnetic field or flux thereof of the one or more magnets to sense the one or more magnets when the flaps are in or near or moving toward the open position. The one or more sensors can be connected to an optic to cause the optic to activate an optic display when the one or more sensors sense the one or more magnets in or near or moving toward the open position.

The one or more sensors can be disposed on an inner surface of the elastic body within viewing cavity. In certain embodiments, the one or more sensors can be disposed on an outer diameter of the elastic body, or embedded within the elastic body, or any combination thereof. The one or more magnets can be disposed on an optic side of the one or more flaps of the diaphragm. Any other suitable position is contemplated herein.

The one or more magnets can include at least one magnet disposed on a plurality of flaps. The one or more sensors can include a sensor for each flap that includes the at least one magnet. In certain embodiments, each flap can include at least one magnet.

In certain embodiments, the one or more magnets can be permanent magnets and the one or more sensors are Hall-effect sensors. Any suitable magnet (e.g., permanent and/or electromagnet) or sensor type configured to sense when the one or more flaps are in the open position is contemplated herein.

In certain embodiments, the one or more sensors can be connected to an optic display controller to send sensor signals thereto. The optic display controller can be configured to determine if a threshold number and/or pattern of sensors sense the one or more magnets to activate the optic display.

In accordance with at least one aspect of this disclosure, an optic (e.g., for a firearm or other suitable device) can include an optic display configured to emit light and be viewed by a user, and an eyecup. The eyecup can include any suitable eyecup disclosed herein.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
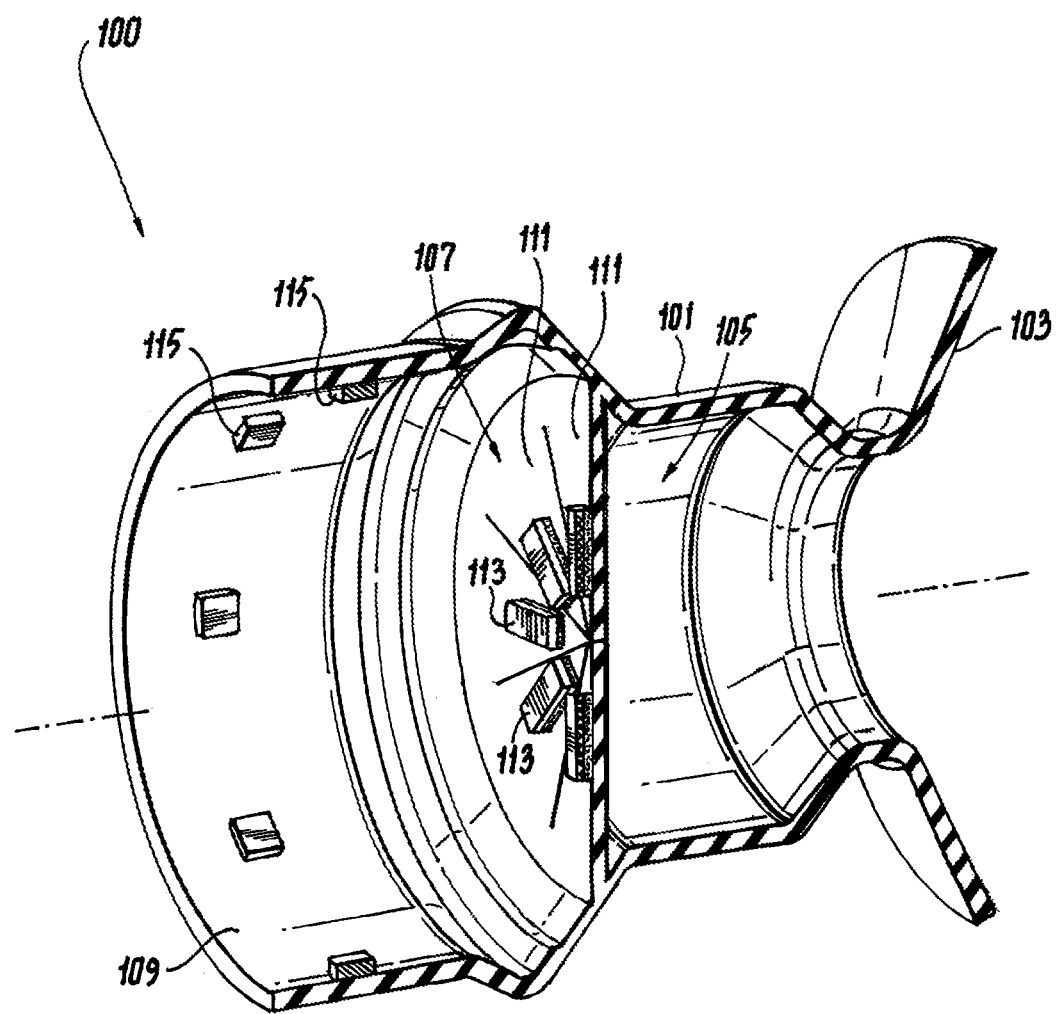
FIG. 1 is a perspective cross-sectional view of an embodiment of an eyecup in accordance with this disclosure, shown in a relaxed state.

Reference will now be made to the drawings wherein like reference numerals identify similar structural features or aspects of the subject disclosure. For purposes of explanation and illustration, and not limitation, an illustrative view of an embodiment of an eyecup in accordance with the disclosure is shown in FIG. 1 and is designated generally by reference character 100. Other embodiments and/or aspects of this disclosure are shown in FIGS. 2-5.

Figure 2:
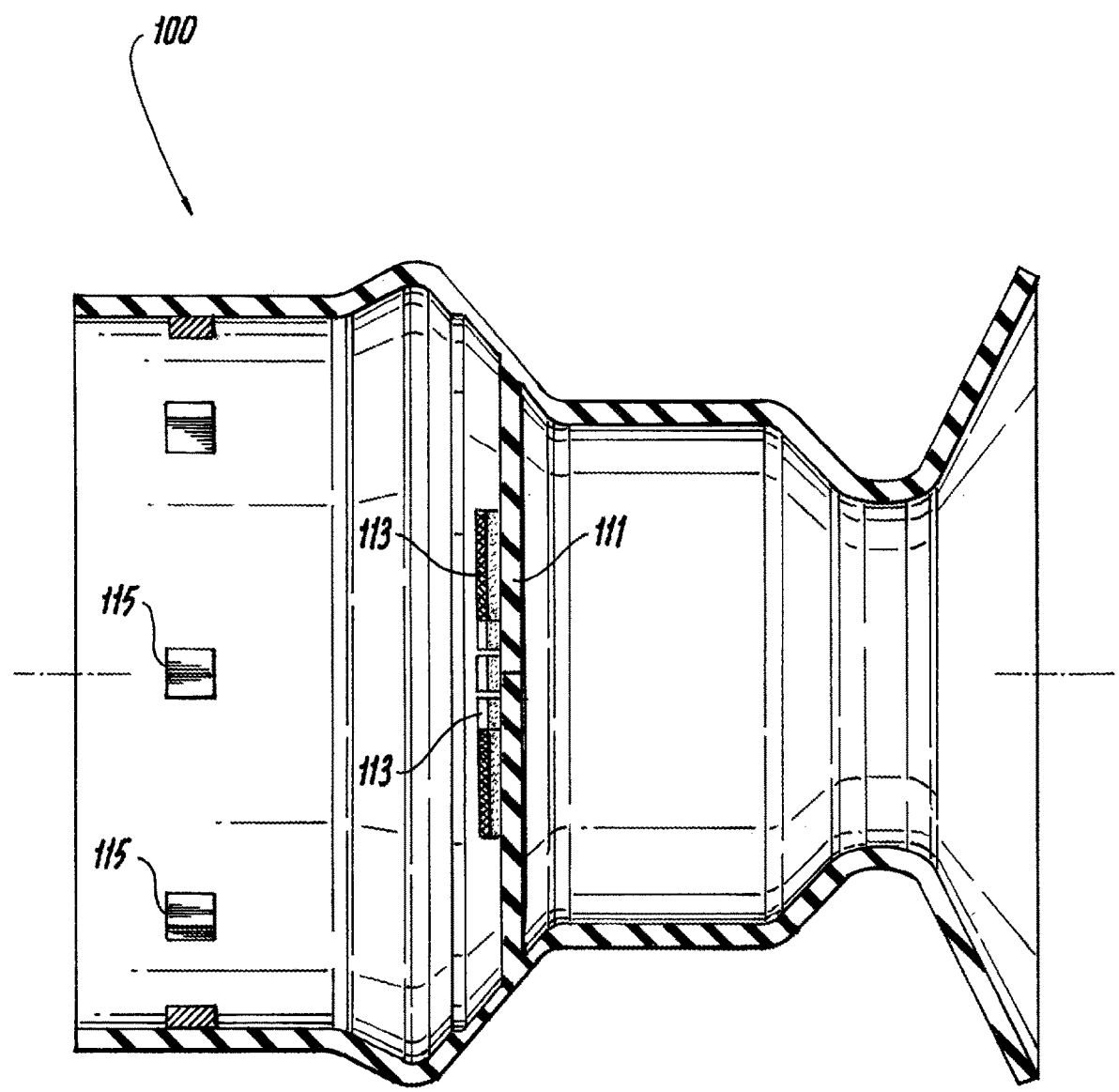
FIG. 2 is a cross-sectional elevation view of the embodiment of FIG. 1.
Figure 3:
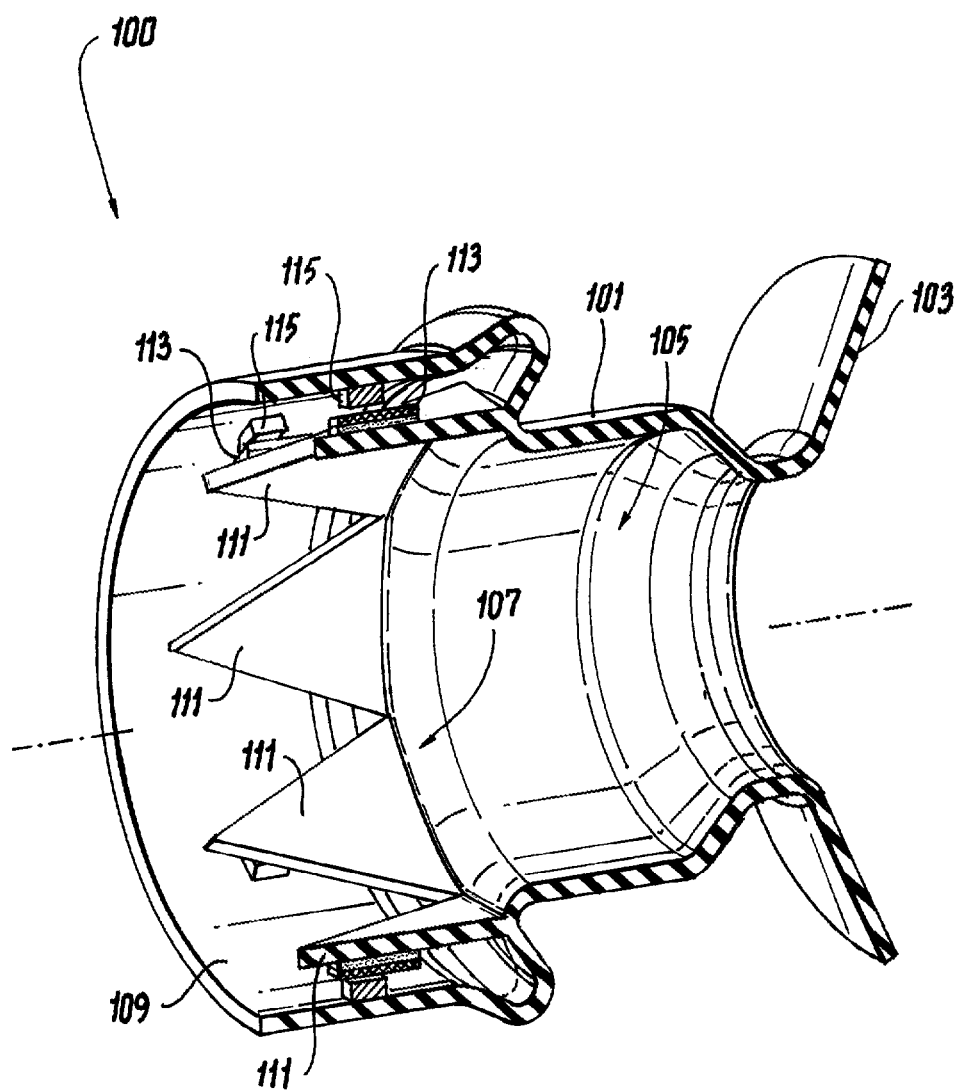
FIG. 3 is a perspective cross-sectional view of the embodiment of FIG. 1, shown in a compressed state.
Figure 4:
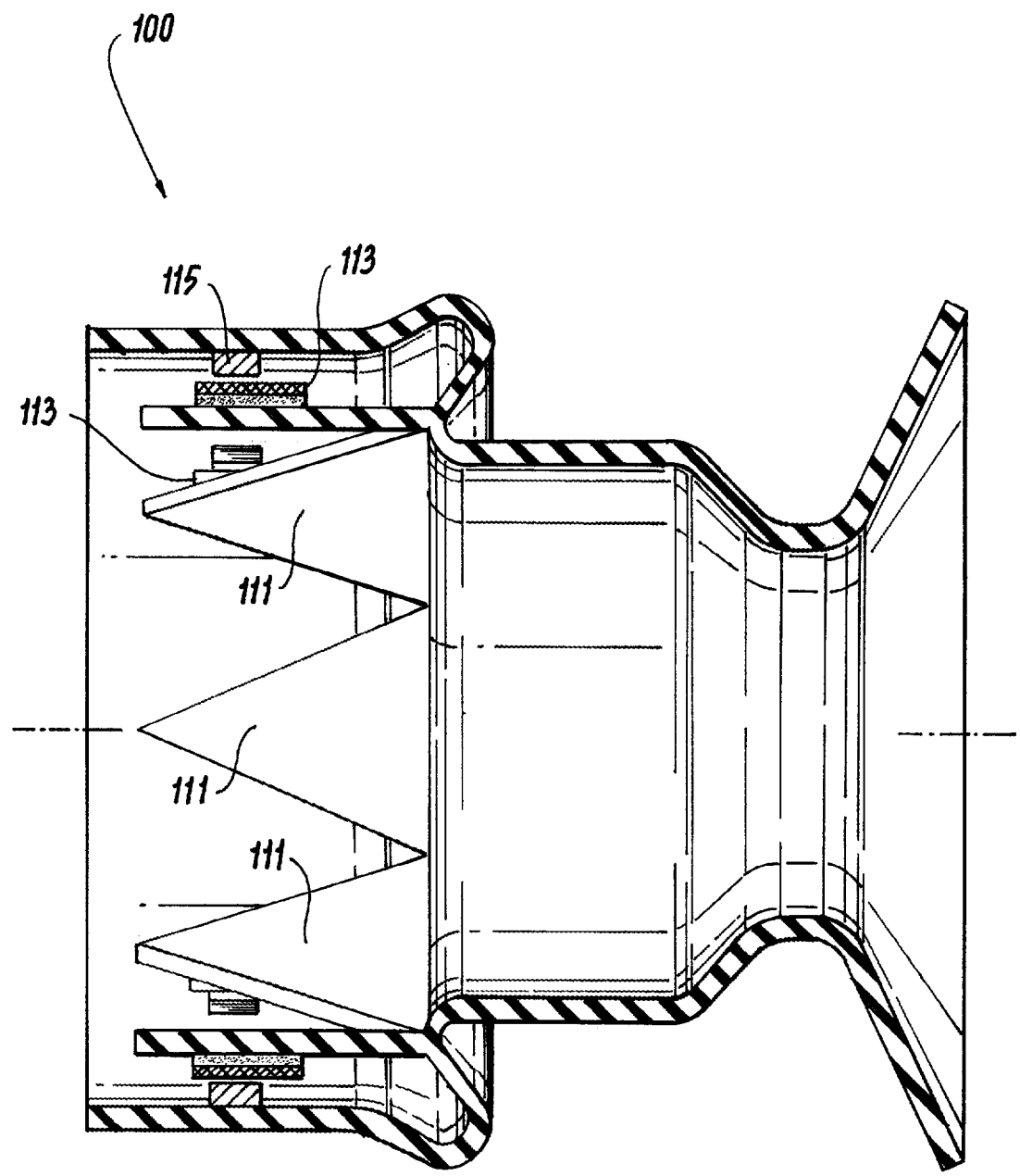
FIG. 4 is a side cross-sectional elevation view of the embodiment of FIG. 3.

Referring to FIGS. 1-4, an eyecup 100 for an optic (e.g., a rifle scope having a display that emits light) can include an elastic body 101 (e.g., made of rubber, silicone, or any other suitable material) forming an eye receiver 103 and a viewing cavity 105. The elastic body 101 can be configured to move between a relaxed state (e.g., as shown in FIGS. 1 and 2) and a compressed state (e.g., as shown in FIGS. 3 and 4). For example, when the eyecup 100 is mounted to an optic (e.g., on a firearm), a user can press the user's face against the eye receiver 103 and advance the elastic body 101 by pushing forward.

The eyecup 100 can include a diaphragm 107 formed from or attached to an inner surface 109 of the elastic body 101. The diaphragm 107 can include one or more flaps 111 configured to be in a closed position (e.g., as shown in FIGS. 1 and 2) when the elastic body 101 is in the relaxed state such that the one or more flaps 111 block sight of an optic through the viewing cavity 105. The one or more flaps 111 can be configured to be in an open position (e.g., as shown in FIGS. 3 and 4) when the elastic body 101 is in the compressed state such that the one or more flaps 111 allow sight of an optic through the viewing cavity 105.

The eyecup 100 can include one or more magnets 113 disposed on at least one of the one or more flaps 111 to move with the one or more flaps 111. The eyecup 100 can also include one or more sensors 115 disposed in a fixed location (e.g., relative to the portion of the eyecup that is fixed relative to the optic), e.g., such as on or in the elastic body 101. The one or more sensors 115 can be configured to sense a magnetic field or flux thereof of the one or more magnets 113 to sense the one or more magnets 113 when the flaps 111 are in or near or moving toward the open position. The one or more sensors 115 can be connected to an optic to cause the optic to activate an optic display (e.g., an LCD or LED screen) when the one or more sensors 115 sense the one or more magnets 113 in or near or moving toward the open position.

The one or more sensors 115 can be disposed on the inner surface (e.g., as shown in FIGS. 1-4) of the elastic body 101 within viewing cavity 105. In certain embodiments, the one or more sensors 115 can be disposed on an outer diameter of the elastic body 101, or embedded within the elastic body 101, or any combination thereof.

The one or more magnets 113 can be disposed on an optic side of the one or more flaps 111 of the diaphragm 107. Any other suitable position is contemplated herein. The one or more magnets 113 can be attached in any suitable manner (e.g., via an adhesive, bonding, friction fit in molded pockets in the one or more flaps 111, or integrally formed inside the elastic material to be integrated to the one or more flaps 111).

The one or more magnets 113 can include at least one magnet 113 disposed on a plurality of flaps 111. The one or more sensors 115 can include a sensor 115 for each flap 111 that includes at least one magnet 113. In certain embodiments, as shown, each flap 111 can include at least one magnet 111. A plurality of sensors 115 can be equally spaced around the inner surface 109 of the elastic body 101 to align with the location of the magnets 113 on flaps 111 in the open position.

In certain embodiments, the one or more magnets 113 can be permanent magnets and the one or more sensors 115 can be Hall-effect sensors. Any suitable magnet (e.g., permanent and/or electromagnet) or sensor type configured to sense when the one or more flaps 111 are in the open position is contemplated herein.

Figure 5:
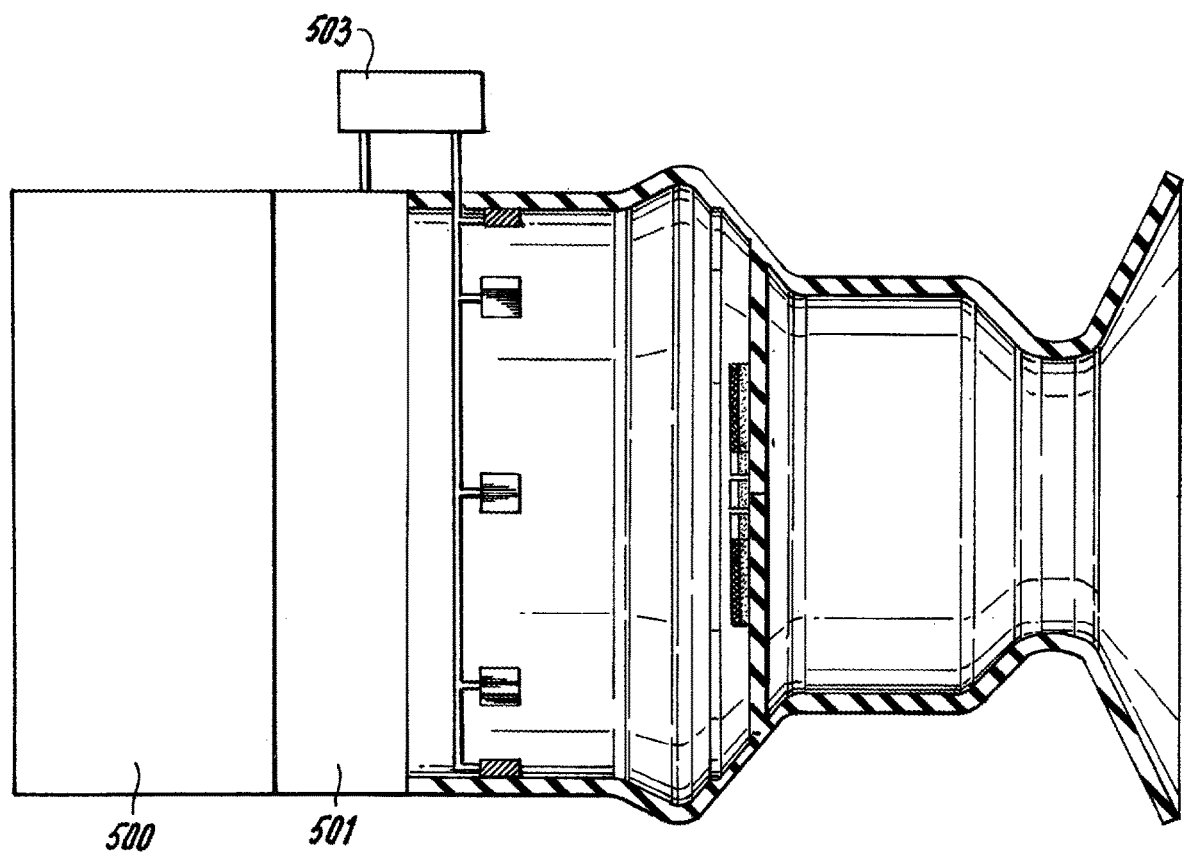
FIG. 5 is a schematic view of an embodiment of an optic in accordance with this disclosure.

In certain embodiments, the one or more sensors 115 can be connected to an optic display controller (e.g., controller 503 as shown in FIG. 5) to send sensor signals thereto. The optic display controller can be configured to determine if a threshold number and/or pattern of sensors 115 sense the one or more magnets 113 to activate the optic display. For example, to prevent erroneous activation (e.g., due to skewed deformation of the elastic body 101 that causes some of the flaps 111, but not all, to open at least partially), the controller can require at least two sensors 115 (e.g., on opposite sides of the cavity 105) to sense magnets 113 before activating the optic display. In certain embodiments, as a means to provide sensitivity to activate in a skew condition (e.g., due to a user's imperfect actuation of the elastic body 101), the controller can be configured to activate the display if a single sensor 115 (or any other suitable number) of a plurality of sensors 115 senses a magnet 113.

Referring additionally to FIG. 5, in accordance with at least one aspect of this disclosure, an optic 500 can include an optic display 501 configured to emit light and be viewed by a user, and an eyecup (e.g., eyecup 100 as described above). The optic 500 can include an optic display controller 503, e.g., as described above.

Embodiments of an optic and/or eyecup as disclosed herein can be used for any suitable device, e.g., a weapon scope (e.g., night vision, thermal, and/or other scopes for firearms), digital scopes, binoculars, microscopes, night vision devices, virtual and augmented reality goggles, cameras, monitoring systems, or any optical device sensitive to light pollution.

Embodiments can include or be used with a scope for a firearm. Embodiments require a user to press the eyecup in to the compressed state to allow a display to be seen, which prevents light emission from the optic when not in use, e.g., avoids detection during use at night, for example. Embodiments can use magnets are much smaller and less expensive than traditional embodiments. Existing sensors are face mounted (facing the user eye) and use only a single large, expensive ring magnet that axially moves to activate face mounted sensors.

In certain embodiments, in the relaxed state, the sensors 115 are not activated due to a large distance and perpendicular orientation of the magnetic field with respect to the branded face of the Hall-effect sensors. When the eyecup is compressed, the diaphragm opens and the magnets move to a very close proximity with the sensors. Since the magnetic flux density grows rapidly with the reduction of the distance, even weak magnets can provide sufficient magnetic flux density to engage the sensors.

Accordingly, the single piece, powerful, and bulky permanent magnet of traditional designs can be replaced with one or more, small, lightweight, and low power magnets. Embodiments can eliminate the risk of breaking or cracking of the magnet. Also, unlike the high power magnet, the smaller, lower power magnets attract much less ferrous debris and external objects. In embodiments, the orientation and close proximity of the magnets with respect to the sensors in a switching position eliminates the need of a tight control of the magnetic and geometrical parameters of the magnets and the negative effect of temperature on the switching position.

Any suitable combination(s) of any disclosed embodiments and/or any suitable portion(s) thereof are contemplated herein as appreciated by those having ordinary skill in the art.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. An eyecup for an optic, comprising:
   an elastic body forming an eye receiver and a viewing cavity, the elastic body configured to move between a relaxed state and a compressed state;
   a diaphragm formed from or attached to an inner surface of the elastic body, the diaphragm comprising one or more flaps, wherein the one or more flaps are configured to be in a closed position when the elastic body is in the relaxed state such that the one or more flaps block sight of an optic through the viewing cavity, wherein the one or more flaps are configured to be in an open position when the elastic body is in the compressed state such that the one or more flaps allow sight of an optic through the viewing cavity;
   one or more magnets disposed on at least one of the one or more flaps to move with the one or more flaps; and
   one or more sensors disposed in a fixed location and configured to sense a magnetic field or flux thereof of the one or more magnets to sense the one or more magnets when the flaps are in or near or moving toward the open position, wherein the one or more sensors are disposed on an inner surface of the elastic body within viewing cavity.

2. The eyecup of claim 1, wherein the one or more sensors are connected to an optic to cause the optic to activate an optic display when the one or more sensors sense the one or more magnets in or near or moving toward the open position.

3. The eyecup of claim 2, wherein the one or more magnets are disposed on an optic side of the one or more flaps of the diaphragm.

4. The eyecup of claim 3, wherein the one or more magnets include at least one magnet disposed on a plurality of flaps.

5. The eyecup of claim 4, wherein the one or more sensors include a sensor for each flap that includes the at least one magnet.

6. The eyecup of claim 5, wherein each flap includes at least one magnet.

7. The eyecup of claim 6, wherein the one or more magnets are permanent magnets, and wherein the one or more sensors are Hall-effect sensors.

8. The eyecup of claim 7, wherein the one or more sensors are connected to an optic display controller to send sensor signals thereto, and wherein the optic display controller is configured to determine if a threshold number and/or pattern of sensors sense the one or more magnets to activate the optic display.

9. An optic, comprising:
   an optic display configured to emit light and be viewed by a user; and
   an eyecup, comprising:
      an elastic body forming an eye receiver and a viewing cavity, the elastic body configured to move between a relaxed state and a compressed state;
      a diaphragm formed from or attached to an inner surface of the elastic body, the diaphragm comprising one or more flaps, wherein the one or more flaps are configured to be in a closed position when the elastic body is in the relaxed state such that the one or more flaps block sight of an optic through the viewing cavity, wherein the one or more flaps are configured to be in an open position when the elastic body is in the compressed state such that the one or more flaps allow sight of an optic through the viewing cavity;
      one or more magnets disposed on at least one of the one or more flaps to move with the one or more flaps; and
      one or more sensors disposed in a fixed location and configured to sense a magnetic field or flux thereof of the one or more magnets to sense the one or more magnets when the flaps are in or near or moving toward the open position, wherein the one or more sensors are disposed on an inner surface of the elastic body within viewing cavity.

10. The optic of claim 9, wherein the one or more sensors are connected to an optic to cause the optic to activate an optic display when the one or more sensors sense the one or more magnets in or near or moving toward the open position.

11. The optic of claim 10, wherein the one or more magnets are disposed on an optic side of the one or more flaps of the diaphragm.

12. The optic of claim 11, wherein the one or more magnets include at least one magnet disposed on a plurality of flaps.

13. The optic of claim 12, wherein the one or more sensors include a sensor for each flap that includes the at least one magnet.

14. The optic of claim 13, wherein each flap includes at least one magnet.

15. The optic of claim 14, wherein the one or more magnets are permanent magnets, and wherein the one or more sensors are Hall-effect sensors.

16. The optic of claim 15, wherein the one or more sensors are connected to an optic display controller to send sensor signals thereto, and wherein the optic display controller is configured to determine if a threshold number and/or pattern of sensors sense the one or more magnets to activate the optic display.

* * * * *